United States Patent
Namose

(10) Patent No.: US 7,037,843 B2
(45) Date of Patent: *May 2, 2006

(54) PLASMA ETCHING METHOD

(75) Inventor: Isamu Namose, Suwa (JP)

(73) Assignee: Seiko Epson Corporation, (JP)

( * ) Notice: Subject to any disclaimer, the term of this patent is extended or adjusted under 35 U.S.C. 154(b) by 268 days.

This patent is subject to a terminal disclaimer.

(21) Appl. No.: 10/373,998

(22) Filed: Feb. 25, 2003

(65) Prior Publication Data

US 2003/0129849 A1   Jul. 10, 2003

Related U.S. Application Data

(62) Division of application No. 09/858,860, filed on May 16, 2001, now Pat. No. 6,649,530.

(30) Foreign Application Priority Data

May 17, 2000   (JP) .............................. 2000-145336

(51) Int. Cl.
    *H01L 21/302* (2006.01)
(52) U.S. Cl. ....................................... 438/706; 216/67
(58) Field of Classification Search ................ 438/706, 438/710, 711, 714; 134/1.1, 1.2, 1.3; 216/63, 216/67, 72
    See application file for complete search history.

(56) References Cited

U.S. PATENT DOCUMENTS

| | | | |
|---|---|---|---|
| 4,863,809 A | 9/1989 | Brar et al. | 428/623 |
| 5,356,476 A | 10/1994 | Foster et al. | 118/725 |
| 5,456,796 A | 10/1995 | Gupta et al. | 438/710 |
| 5,616,208 A * | 4/1997 | Lee | 156/345.24 |
| 5,622,595 A * | 4/1997 | Gupta et al. | 438/710 |
| 5,769,952 A * | 6/1998 | Komino | 118/733 |
| 5,783,492 A * | 7/1998 | Higuchi et al. | 438/710 |
| 6,326,216 B1 | 12/2001 | Kato et al. | 438/3 |

FOREIGN PATENT DOCUMENTS

| | | |
|---|---|---|
| JP | 02-032539 | 2/1990 |
| JP | 08-115901 | 5/1996 |
| JP | 08-165584 | 6/1996 |
| JP | 10-150019 | 6/1998 |
| JP | 2001-284320 | 10/2001 |

* cited by examiner

*Primary Examiner*—Kin-Chan Chen
(74) *Attorney, Agent, or Firm*—Harness, Dickey & Pierce, P.L.C.

(57) ABSTRACT

To provide a plasma etching method that can suppress discharge of active gases that do not contribute to plasma etching into the atmosphere, a plasma etching apparatus 10 is composed of a vacuum chamber 12, a plasma processing section 14, a helium supply section 16, a PFC supply section 18, a switching device 20, and an exhaust opening 22. In the use of the apparatus 10, first, helium is introduced into the vacuum chamber 12 through the switching device 20. Then, while introducing the helium, helium is also discharged from the exhaust opening 22 to set the interior of the vacuum chamber 12 at a specified pressure. When the pressure within the vacuum chamber 12 is stabilized at the specified pressure, plasma is generated within the vacuum chamber 12, and at the same time, helium is switched to carbon tetrafluoride by the switching device 20. As a result, carbon tetrafluoride that does not contribute to the plasma etching is prevented from being discharged into the atmosphere.

3 Claims, 5 Drawing Sheets

12: Vacuum chamber
26: Semiconductor wafer

PLASMA ETCHING METHOD

This application is a division of U.S. application Ser. No. 09/858,860 filed on May 16, 2001, now U.S. Pat. No. 6,649,530.

TECHNICAL FIELD

The present invention relates to a plasma etching method, and more particularly to a plasma etching method that can reduce the amount of active gas that is used for etching and PFC that is a global warming gas.

BACKGROUND TECHNOLOGY

Conventionally, in the process for manufacturing semiconductor devices, etching that partially cuts a semiconductor wafer or material deposited thereon is frequently used. Plasma patching, sputter etching or reactive ion etching methods are known ways to perform the etchings. In particular, plasma etching uses chemical reaction such that only materials that need to be etched are removed (in other words, selectively etched). For this reason, plasma patching is widely used in the process of manufacturing semiconductor devices.

FIG. 5 shows an illustration to describe a structure of a chamber in which plasma etching is conducted. Electrodes that generate plasma are disposed within the chamber 1, and the electrodes are connected to a high-frequency plasma generation apparatus that is provided outside the chamber. Also, within the same chamber 1, a semiconductor wafer mounting section is provided, such that a semiconductor wafer and material deposited thereon can be etched.

The chamber 1 described above is equipped with a reactive gas supply opening 2 and an exhaust opening 3 as shown in the figure, whereby a reactive gas can be introduced into the chamber 1 under a reduced pressure through a flow quantity control valve 4, and the reactive gas can be exhausted from the chamber 1 by a vacuum pump (not shown) provided in the succeeding stage of the exhaust opening 3. PFC such as $CF_4$, $CHF_3$, $C_4F_8$ or the like is used as the reactive gas to conduct an etching of silicon oxide ($SiO_2$) that is used as a dielectric material.

FIG. 6 shows a graph of an operation process of the chamber 1. As shown in the figure, for conducting an etching on a semiconductor wafer within the chamber 1, first, the pressure within the chamber 1 is sufficiently reduced by the vacuum pump (a range ① in the figure), and the flow quantity control valve 4 is opened to introduce a reactive gas into the chamber 1. As the reactive gas is introduced into the chamber 1, the reactive gas is also discharged through the exhaust opening 3. It is noted that, when the reactive gas is introduced, the degree of opening and closing of the flow quantity control valve 4 is adjusted, such that the pressure within the chamber 1 is adjusted to stabilize at a predetermined value (a range ② in the figure).

After the pressure within the chamber 1 is stabilized at the predetermined value, the high frequency plasma generation apparatus is operated to generate plasma of the reactive gas between the electrodes, whereby an etching process for the semiconductor wafer is conducted (a range ③ in the figure). When a predetermined time has passed, the flow quantity control valve 4 is closed to stop the supply of the reactive gas, and the high frequency plasma generation apparatus is also stopped to complete the etching process (a range ④ in the figure).

However, in the etching process described above, the following problems are encountered. In a preceding stage of the etching (the range ② in the figure), the pressure within the chamber 1 needs to be set at a predetermined value, and a reactive gas that is used for the plasma process is used for setting this value. In other words, during the pressure setting within the chamber, a reactive gas that does not contribute to the plasma etching is exhausted through the exhaust opening 3 into the atmosphere as it is. This results in a higher cost. Further, since the PFC that is used as a reactive gas has a high GWP (global warming potential) that is several thousands—several ten thousands times higher than that of carbon dioxide, it is not preferable for the environment to exhaust the gas into the atmosphere.

The present invention has been made in view of the problems of the conventional art, and it is an object of the present invention to provide a plasma etching method that can suppress discharge of PFC that does not contribute to the plasma etching into the atmosphere.

SUMMARY OF THE INVENTION

The present invention has been made based on knowledge that, when a pressure adjustment in the chamber is conducted by material other than PFCs (perfluorocarbon and compounds thereof (HFC) in which part of PFC is replaced with hydrogen), and the material is switched to PFC after the pressure adjustment is completed, PFC that does not contribute to plasma etching can be discharged into the atmosphere.

Namely, a plasma etching method is characterized in that: an inactive gas is passed into a chamber under a reduced pressure; after the chamber is set to a specified pressure, the inactive gas is switched to an active gas and plasma is generated in the active gas; and an etching of a semiconductor wafer disposed in the chamber is conducted.

In the plasma etching method, since the pressure adjustment within the chamber is conducted using an inactive gas, an active gas does not need to be used for the pressure adjustment, the amount of the active gas to be used can be reduced, and an active gas that does not contribute to the etching is prevented from being discharged into the atmosphere. Also, in accordance with the present method, only the process for adjusting a pressure within the chamber is changed, and the etching process is not changed. Accordingly, the amount of an active gas to be used can be reduced without changing the characteristics of the etching itself. It is noted that, after the pressure adjustment, an active gas in the same amount as that of the inactive gas may be introduced into the chamber, so that the etching is conducted by the introduced active gas within the chamber.

Another plasma etching method is characterized in that: an inactive gas is passed into a chamber under a reduced pressure; after the chamber is set to a specified pressure, plasma is generated in the inactive gas; after the plasma is generated, the inactive gas is switched to an active gas; and an etching of a semiconductor wafer disposed in the chamber is conducted. In the plasma etching method, since the pressure adjustment within the chamber is conducted using an inactive gas, an active gas does not need to be used for the pressure adjustment, the amount of the active gas to be used can be reduced, and an active gas that does not contribute to the etching is prevented from being discharged into the atmosphere. Also, plasma is generated in the inactive gas after the pressure is adjusted, and then the inactive gas is switched to an active gas (the inactive gas is replaced with an active gas in the same amount). Therefore, plasma is generated in the active gas as the active gas is introduced (under the influence of the plasma inactive gas). As a result, no time is needed from the introduction of the active gas until the stabilization of the plasma such that the active gas can be used for the etching without being wasted.

Also, in accordance with the present method, only the process for adjusting a pressure within the chamber is changed, and the etching process is not changed. Accordingly, the amount of an active gas to be used can be reduced without changing the characteristics of the etching itself.

Yet another plasma etching method is characterized in that: an inactive gas is passed into a chamber under a reduced pressure; after the chamber is set to a specified pressure, plasma is generated in the inactive gas and at the same time an active gas is introduced into the chamber; and an etching of a semiconductor wafer disposed in the chamber is conducted using plasma generated in a mixed body of the inactive gas and the active gas.

In the plasma etching method, since the pressure adjustment within the chamber is conducted using an inactive gas, an active gas does not need to be used for the pressure adjustment, the amount of the active gas to be used can be reduced, and an active gas that does not contribute to the etching is prevented from being discharged into the atmosphere. Also, plasma is generated in the inactive gas after the pressure is adjusted, and then the inactive gas is switched to an active gas. Therefore, plasma is generated in the active gas as the active gas is introduced (under the influence of the plasma of the inactive gas). As a result, no time is needed from the introduction of the active gas until the stabilization of the plasma, such that the active gas can be used for the etching without being wasted. This example uses a process that includes not only an active gas but also an inactive gas as a base etching condition, such that the inactive gas does not need to be completely switched to the active gas. Also, since the inactive gas is continuously introduced from the time of the pressure adjustment, the pressure within the chamber and the generated plasma can be stabilized.

Also, for the purpose of maintaining the pressure within the chamber constant, when the inactive gas is switched to the mixed body of the inactive gas and the active gas, the flow quantity of the inactive gas is restricted by a specified amount, and the active gas is introduced in an amount corresponding to the amount of the reduced inactive gas, such that the overall flow quantity becomes constant.

Another plasma etching method is characterized in that the active gas is PFC. As a result, the amount of PFC to be used can be reduced and PFC that does not contribute to the etching is prevented from being discharged into the atmosphere.

Still another plasma etching method is characterized in that the inactive gas is helium. Since helium has a small atomic weight among inactive gases, when plasma is generated in helium, the influence that may be inflicted on semiconductor wafers and the internal walls of the chamber can be reduced (sputtering or the like does not occur).

BRIEF DESCRIPTOIN OF THE DRAWINGS

DETAILED DESCRIPTION OF THE PRESENT INVENTION

A plasma etching method in accordance with a preferred embodiment of the present invention is described below in detail with reference to the accompanying drawings.

Figure 1:
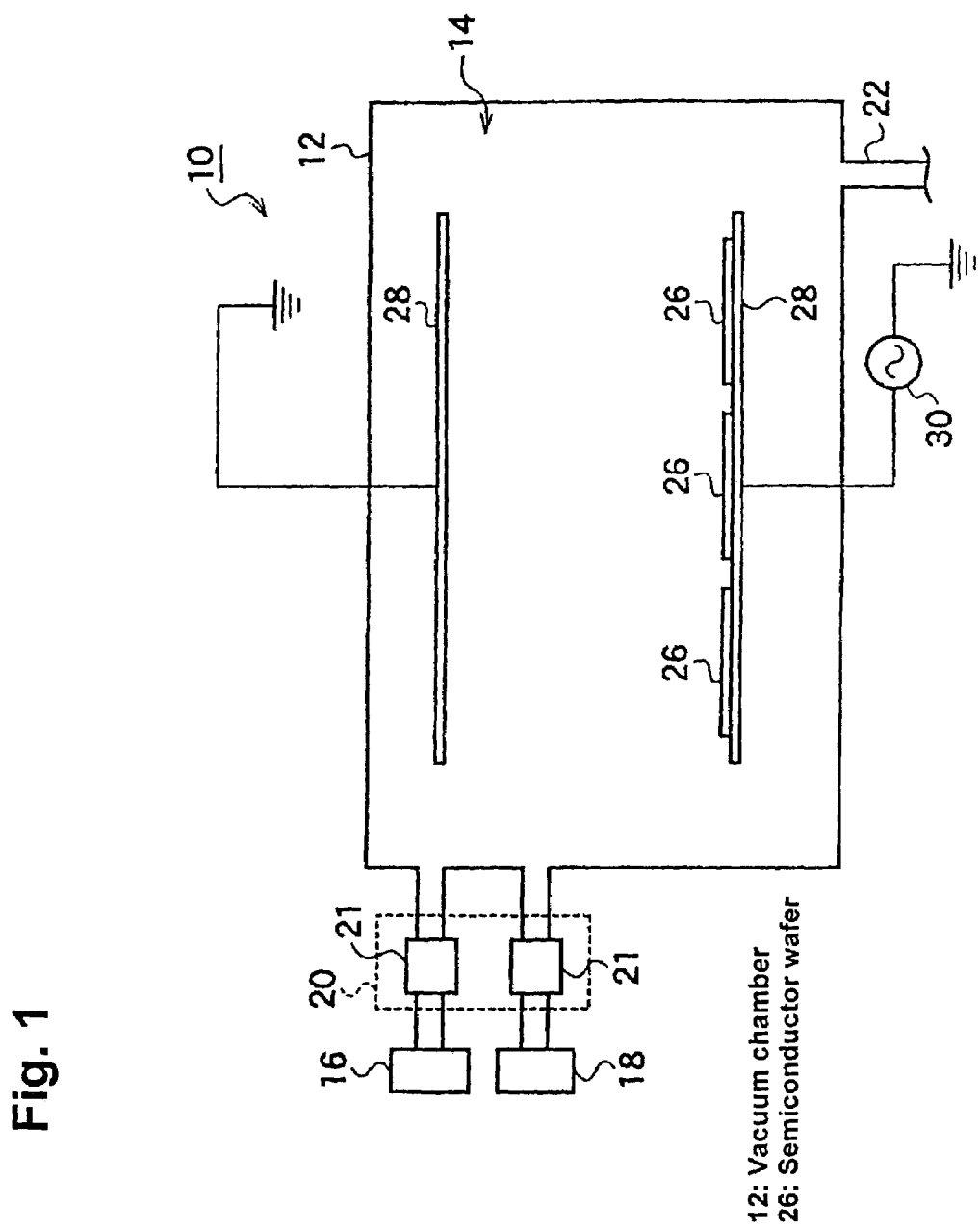
FIG. 1 shows an illustration to describe a structure of a plasma etching apparatus in accordance with one embodiment of the present invention.

FIG. 1 shows an illustration to describe a structure of a plasma etching apparatus in accordance with one embodiment of the present invention. As shown in the figure, a plasma etching apparatus 10 in accordance with the embodiment of the present invention is composed of a vacuum chamber 12 that is capable of accommodating semiconductor wafers, a plasma processing section 14 within the vacuum chamber 12, which is capable of conducting a plasma process on semiconductor wafers introduced in the vacuum chamber 12, a helium supply section 16 that is disposed outside the vacuum chamber 12 and is capable of transferring helium gas (herein below referred to as helium) that is an inactive gas, a PFC supply section 18 that is likewise disposed outside the vacuum chamber 12 and is capable of transferring carbon tetrafluoride ($CF_4$) that is PFC, a switching device 20 that is disposed between the helium supply section 16, the PFC supply section 18 and the vacuum chamber 12, which is capable of introducing helium and carbon tetrafluoride into the vacuum chamber 12, and an exhaust opening 22 that discharges helium and carbon tetrafluoride that are introduced into the vacuum chamber 12 by the switching device 20 from the vacuum chamber 12.

The vacuum chamber 12 is provided with a vacuum preparation chamber disposed adjacent thereto and a vacuum pump that is connected to the succeeding stage of an exhaust opening 22 of the vacuum chamber 12 (neither are shown). Therefore, in the vacuum chamber 12, semiconductor wafers 26 that are subject to plasma etching can be transferred from the vacuum preparation chamber in which the pressure therein is reduced to a predetermined value. Also, after the semiconductor wafers 26 are brought into the vacuum chamber 12, the vacuum pump can be operated to set the degree of vacuum in the vacuum chamber 12 at a predetermined value.

A plasma processing section 14 is defined within the vacuum chamber 12, and includes a pair of plate-shaped parallel electrodes 28. One of the electrodes 28 is connected to a high-frequency power supply 30 that is disposed outside the vacuum chamber 12, and the other of the electrodes 28 provides a grounding potential, such that plasma can be generated between the electrodes 28. In accordance with the present embodiment, the semiconductor wafers 26 are placed above the electrode 28 that is connected to the high-frequency power supply 30, such that an etching process for the semiconductor wafers 28 can be conducted with plasma generated between the electrodes 28.

The helium supply section 16 and the PFC supply section 18 are formed from pressure containers provided with valves (not shown) that can be opened to enable transferring of the gases. Further, the helium supply section 16 and the PFC supply section 18 are connected to the switching device 20, such that the gases can be introduced into the vacuum chamber 12 through the switching device 20.

The switching device 20 is also capable of switching the gas to be introduced in the vacuum chamber 12 from helium to carbon tetrafluoride (and vice versa), restricting the flow quantity of helium by a specified amount, or introducing carbon tetrafluoride that is equivalent to the quantity of helium that is reduced. (It is noted that the overall flow quantity of the gases introduced in the vacuum chamber 12 is preferably constant).

The switching device 20 is generally composed of flow quantity proportion control valves 21, in which an externally applied voltage is changed to adjust the degree of opening and closing of the valves to thereby set introduction ratios of the gases.

An etching process for the semiconductor wafers 26 using the plasma etching apparatus 10 thus composed is described below.

Figure 2:
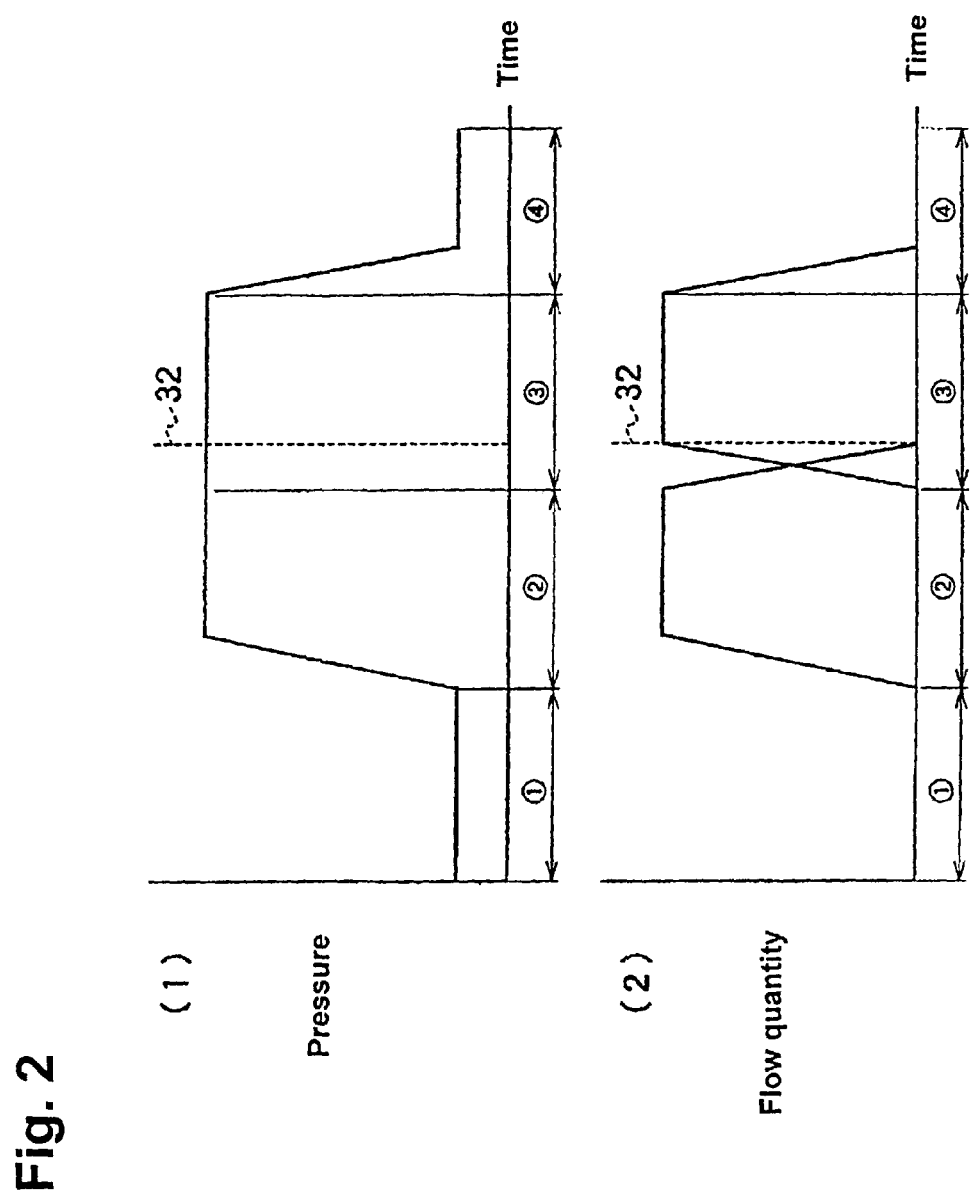
FIG. 2 shows graphs showing changes in the pressure within a vacuum chamber 12 and changes in the flow quantity of gas introduced in the vacuum chamber 12.

FIG. 2 shows graphs showing changes in the pressure within the vacuum chamber 12 and changes in the flow quantity of gases introduced in the vacuum chamber 12.

When the semiconductor wafers 26 are subject to an etching process using the plasma etching apparatus 10, first, the semiconductor wafers 26 are transferred from the vacuum preparation chamber to the vacuum chamber 12, then the vacuum pump (not shown) is operated to set the pressure within the vacuum chamber 12 to a specified value. This state is indicated by a range ① in FIG. 2, in which, referring to FIG. 2 (2), no gas is introduced in the vacuum chamber 12 from the helium supply section 16 or the PFC supply section 18, such that the flow quantity is 0 (zero).

After the interior of the vacuum chamber 12 is set to a specified value, the switching device 20 is operated to introduce helium into the vacuum chamber 12, to thereby stabilize the pressure within the vacuum chamber 12 at a specified value. This state is indicated by a range ② in the same figure.

After the pressure within the vacuum chamber 12 is stabilized by helium, the switching device 20 is operated to switch the gas to be introduced in the vacuum chamber 20 from helium to carbon tetrafluoride. It is noted that, at the time of switching the gases, the total quantity of the gases to be introduced into the vacuum chamber 12 is constant, such that the pressure within the vacuum chamber 12 can be maintained constant. In the same figure, the operation of switching the gases is indicated by a range ③.

When helium introduced in the vacuum chamber 12 is completely replaced with carbon tetrafluoride in the range ③ shown in FIG. 2 (2), the high-frequency power supply 30 is operated to generate plasma between the pair of the electrodes 28. The timing to operate the high-frequency power supply 30 is indicated in the same figure by a broken line 32. At the time indicated by the broken line 32, the gas within the vacuum chamber 12 is completely switched from helium to carbon tetrafluoride, and plasma is generated in this state to etch dielectric material (silicon oxide: $SiO_2$) formed on the surface of the semiconductor wafers 26. The etching work is conducted during the period from the time at the broken line 32 until the range ③ is completed, and then the operation of the high-frequency power supply 30 is stopped when the range ③ is completed whereby the etching work is finished.

After the etching work is completed, the operation of the switching device 20 is stopped so that the gas is not introduced into the vacuum chamber 12, and the gas that is already present in the vacuum chamber 12 is pumped out by the vacuum pump to provide the pressure within the vacuum chamber 12 similar to that in the range ①. A series of the states described above is shown by a range ④ in the same figure.

When the vacuum chamber 12 reaches a pressure similar to that in the range ①, the semiconductor wafers 26 whose etching process has been completed are transferred to the adjacent vacuum preparation chamber, new semiconductor wafers 26 are brought in the vacuum chamber 12, and the series ①→②→③→④ is repeated.

In the plasma etching method described above, the pressure adjustment of the vacuum chamber 12 is conducted with helium, which is then switched to carbon tetrafluoride. Therefore, carbon tetrafluoride that does not contribute to plasma etching can be almost completely eliminated.

It is noted that, in the process described above, the pressure within the vacuum chamber 12 is stabilized with helium, which is then switched to PFC to conduct plasma etching. However, oxygen may be added thereto. More specifically, when resist is present on the surface of a material that is subject to etching, first, the pressure adjustment within the vacuum chamber 12 is conducted, and thereafter, a mixed body of PFC and oxygen may be introduced into the vacuum chamber 12 to conduct an etching.

When resist is not present on the surface of a material that is subject to etching, oxygen may be introduced with helium. (When the resist contacts oxygen, the resist is removed.) The method in which oxygen is added can be used in an etch-back to improve flatness between layers or in forming a sidewall of an LDD.

Figure 3:
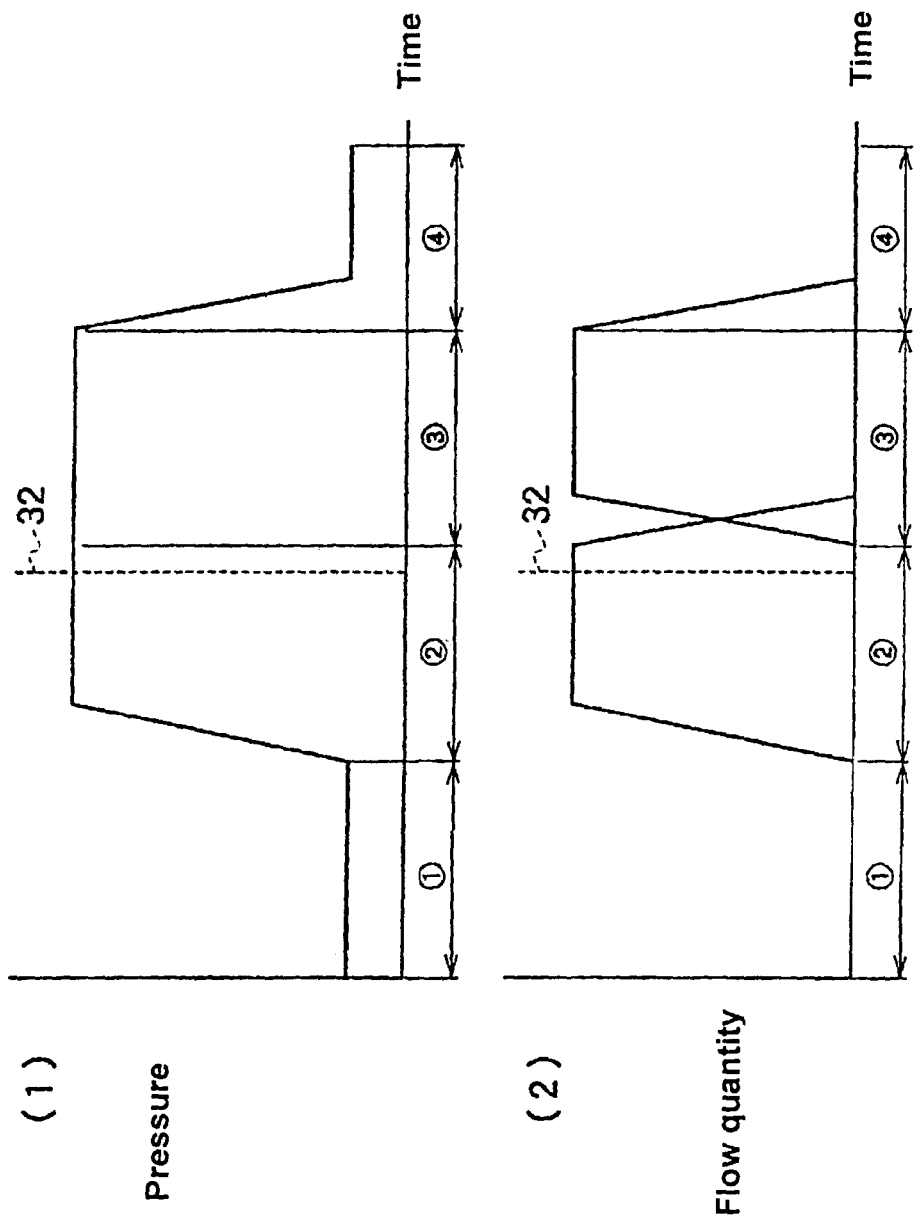
FIG. 3 shows a graph of an example in which the plasma etching method shown in FIG. 2 is applied.

FIG. 3 shows a graph of an example in which the plasma etching method shown in FIG. 2 is applied. The example in the figure is different from that shown in FIG. 2 in that the position of the broken line 32 does not exist in the range ③ but exists in the range ②.

Namely, referring to FIG. 3, when only helium is introduced into the vacuum chamber 12, the high-frequency power supply 30 is operated to generate plasma. By generating plasma when helium is being introduced, and successively changing the gas in the vacuum chamber 12 from helium to carbon tetrafluoride, the introduced carbon tetrafluoride immediately becomes a plasma due to the influence of the plasma of helium. As a result, carbon tetrafluoride that does not contribute to the plasma etching is not discharged from the vacuum chamber 12 until the plasma stabilizes, and the amount of carbon tetrafluoride to be used can be reduced.

In the present embodiment, helium is used as an inactive gas. However, the present invention is not limited to this embodiment, and other inactive gases can be used as long as sputtering is not caused on the semiconductor wafers 26 and on the internal walls of the vacuum chamber 12 when the gases become a plasma.

Figure 4:
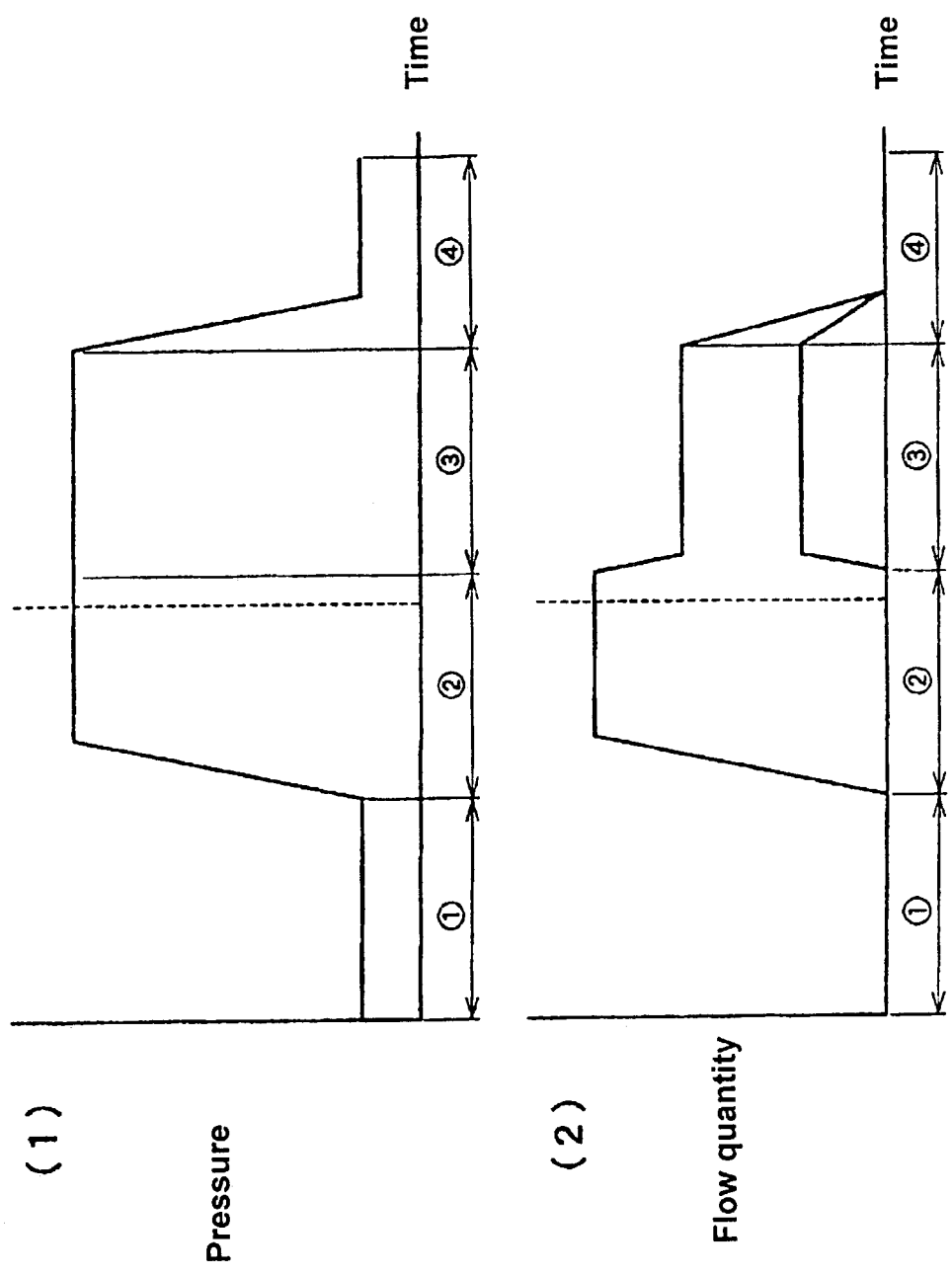
FIG. 4 shows a graph of an example in which the plasma etching method shown in FIG. 3 is applied.
Figure 5:
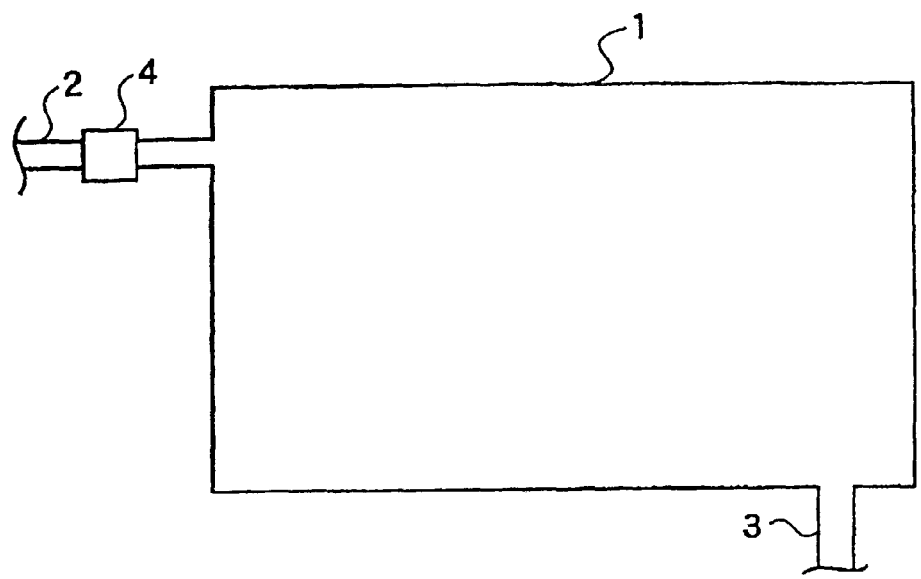
FIG. 5 shows an illustration to describe a structure of a chamber in which plasma etching is conducted.
Figure 6:
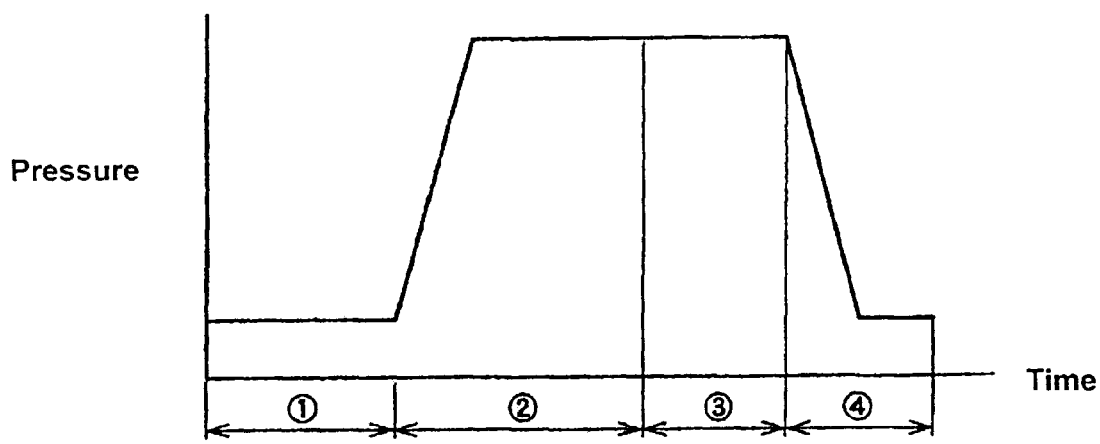
FIG. 6 shows a graph indicating an operation process of the chamber 1.

FIG. 4 shows a graph of an example in which the plasma etching method shown in FIG. 3 is applied. The example in the figure is different from that shown in FIG. 3 in that, after the pressure within the vacuum chamber 12 is stabilized, the gas is not completely replaced, but plasma etching is conducted using a mixed body of an inactive gas and PFC.

In other words, an inactive gas is not completely changed to PFC by the switching device 20 in the time range ③ in the figure, but the flow quantity of the inactive gas is somewhat restricted, and PFC that makes up for it is introduced. Plasma is generated with a mixed body of the inactive gas and the PFC to etch the semiconductor wafers 26. Even in this case, the pressure adjustment is conducted with the inactive gas in the time range ②, such that the PFC having no contribution to the plasma etching is not discharged outside the vacuum chamber 12. Therefore, the amount of PFC to be used can be reduced.

A specific example of the embodiment shown in FIG. 4 is described below.

In the embodiment example shown in FIG. 4, helium is used as an inactive gas, and $CF_4$ and $CHF_3$ are used as PFC. During a range ② in the figure, the ratio of gases introduced into the vacuum chamber 12 is 100% of helium that is intended to adjust and stabilize the pressure inside the vacuum chamber 12. After the pressure within the vacuum chamber 12 is stabilized, the amount of helium being introduced is restricted as indicated in a time range ③ (an introduction ratio: 100%→50%), and $CF_4$ (an introduction ratio: 25%) and $CHF_3$ (an introduction ratio: 25%) are also introduced, and plasma etching is conducted in a state including helium. It is noted that the inventor of the present invention confirmed that, when an oxide film ($SiO_2$) formed on the surface of the semiconductor wafer 28 is etched using the gases described above, the etching rate becomes 450~500 nm when the power of the high-frequency power supply source is 900 W (Watt).

The embodiments of the present invention are described with PFC being $CF_4$ or $CHF_3$. However, the PFC is not limited to these two types, and a variety of different types such as $SF_6$, $NF_3$, $C_2F_6$, $C_3F_8$, $C_4F_8$ also exist. It goes without saying that the amount of usage can be reduced by using the methods described above even with these PFCs.

What is claimed is:

1. A plasma etching method comprising:
   placing a semiconductor wafer in a vacuum preparation chamber;
   transferring the semiconductor wafer from the vacuum preparation chamber to a vacuum chamber;
   evacuating the vacuum chamber to reduce a pressure of the vacuum chamber;
   introducing an inactive gas into the vacuum chamber that is under the reduced pressure;
   after the chamber is set to a specified pressure, generating a plasma in the inactive gas at the same time an active gas is introduced into the vacuum chamber; and
   etching the semiconductor wafer disposed in the vacuum chamber in a mixed body of the inactive and active gas;
   wherein a total quantity of the gases in the vacuum chamber remains constant during the introduction of the active gas.

2. A plasma etching method according to claim 1, wherein the active gas further comprises PFC.

3. A plasma etching method according to claim 1, wherein the inactive gas further comprises helium.

* * * * *